(12) United States Patent
Pasdar et al.

(10) Patent No.: US 10,261,119 B2
(45) Date of Patent: Apr. 16, 2019

(54) SMART SENSOR NETWORK FOR POWER GRID HEALTH MONITORING

(71) Applicants: Amir Mehdi Pasdar, Solon, OH (US); Yilmaz Sozer, Stow, OH (US); Jose Alexis De Abreu-Garcia, Akron, OH (US)

(72) Inventors: Amir Mehdi Pasdar, Solon, OH (US); Yilmaz Sozer, Stow, OH (US); Jose Alexis De Abreu-Garcia, Akron, OH (US)

(73) Assignee: The University of Akron, Akron, OH (US)

( * ) Notice: Subject to any disclaimer, the term of this patent is extended or adjusted under 35 U.S.C. 154(b) by 58 days.

(21) Appl. No.: 15/307,856

(22) PCT Filed: Apr. 29, 2015

(86) PCT No.: PCT/US2015/028249
§ 371 (c)(1),
(2) Date: Oct. 31, 2016

(87) PCT Pub. No.: WO2015/168260
PCT Pub. Date: Nov. 5, 2015

(65) Prior Publication Data
US 2017/0052222 A1   Feb. 23, 2017

Related U.S. Application Data

(60) Provisional application No. 61/985,552, filed on Apr. 29, 2015.

(51) Int. Cl.
*H02H 1/00*   (2006.01)
*H02H 7/26*   (2006.01)
(Continued)

(52) U.S. Cl.
CPC .......... *G01R 31/021* (2013.01); *G01R 27/16* (2013.01); *G01R 31/085* (2013.01); *G01R 31/11* (2013.01);
(Continued)

(58) Field of Classification Search
CPC .... G01R 31/08; G01R 31/081; G01R 31/083; G01R 31/085; G01R 31/11; G01R 31/088;
(Continued)

(56) References Cited

U.S. PATENT DOCUMENTS 4,775,839 A * 10/1988 Kosina ................. G01R 31/085
324/520
9,941,683 B2 * 4/2018 Olivas .................. H02H 1/0007

OTHER PUBLICATIONS

Yang, Yi, et al. "Power line sensornet—a new concept for power grid monitoring." Power Engineering Society General Meeting, 2006. IEEE. IEEE, 2006.*

(Continued)

*Primary Examiner* — Ryan Johnson
(74) *Attorney, Agent, or Firm* — Renner Kenner Greive Bobak Taylor and Weber (57) ABSTRACT

A smart sensor network for power grid health monitoring includes a plurality of spaced sensors that are magnetically coupled to the power transmission line to be monitored. The sensors include a signal injection unit and a signal sensing unit. As such, one of the sensors acts to inject, via its signal injection unit, a high frequency signal through the magnetic coupling into the power transmission line, while sensors on either side of the signal injecting sensor act to block the injected signal, which is then detected by the signal sensing unit of the injecting sensor, and is used to measure the impedance of the power transmission line segment being analyzed. Based on the difference between a pre-measured impedance of the power transmission line being monitored (Continued)

and the actual impedance value of the power transmission line being measured by the sensor, the health of the power line can be obtained.

12 Claims, 4 Drawing Sheets

(51) Int. Cl.
    *G01R 27/16*     (2006.01)
    *G01R 31/02*     (2006.01)
    *G01R 31/08*     (2006.01)
    *G01R 31/11*     (2006.01)
    *H01H 47/00*     (2006.01)

(52) U.S. Cl.
    CPC ............ *H01H 47/00* (2013.01); *H02H 1/003* (2013.01); *H02H 7/26* (2013.01); *G01R 31/024* (2013.01)

(58) Field of Classification Search
CPC ...... G01R 27/16; G01R 31/024; H02H 1/003; H02H 1/0007; H02H 1/0061; H02H 7/26; H02H 7/261
See application file for complete search history.

(56) References Cited

OTHER PUBLICATIONS

Pasdar, Amir Mehdi, Yilmaz Sozer, and Iqbal Husain. "Novel method for real time overhead power line segments high frequency impedance measurement based on signal injection." Applied Power Electronics Conference and Exposition (APEC), 2013 Twenty-Eighth Annual IEEE. IEEE, Mar. 17-21, 2013.*

* cited by examiner

SMART SENSOR NETWORK FOR POWER GRID HEALTH MONITORING

CROSS-REFERENCE TO RELATED APPLICATION

This application claims the benefit of U.S. Provisional Application No. 61/985,552 filed Apr. 29, 2014, the contents of which are incorporated herein by reference.

TECHNICAL FIELD

Generally, the present invention relates to monitoring an electrical power grid formed of power transmission lines. Particularly, the present invention relates to a power grid protection system for detecting high-impedance faults (HIF) that occur on power transmission lines. More particularly, the present invention relates to a power grid protection system that uses a smart sensor network to monitor the health of power transmission lines of an electrical power grid and to detect electrical faults therein in real-time.

BACKGROUND OF THE INVENTION

Power transmission lines, which carry electrical power from a power generation plant, are one of the most critical components of an energy generation and transmission system that together forms a power grid. Due to their nature, power transmission lines are susceptible to contact faults, which are the result of an unwanted conduction path that has formed between a conductive surface of the power line and a non-conductive surface, such as a tree. That is, such contact faults are the result of the growth of trees under such power transmission lines, a break in an electrical conductor of the power transmission line, as well as, animal or human contact with the power transmission line. Thus, ensuring the safety and functionality of the power transmission lines of the power grid is a critical concern for its operators.

One type of fault that can impact the power grid is a high-impedance fault. A high-impedance fault (HIF) is typically the result of an electrical contact between a conductor in the power transmission line and a non-conductive surface, which due to the HIF, restricts the fault current below a detectable level of conventional electrical relays. Since high-impedance faults often result in an energized conductor that is in reach of individuals in the public, it poses a tremendous threat or hazard to both the personal safety of such individuals, and to the security of personal property. Such a high impedance fault is difficult to detect because the high impedance fault current appears very similar in magnitude to the small variations of the power network load that are experienced in an energized power grid.

Another safety concern for operators of the power grid relates to the process associated with re-energizing a de-energized power transmission line. This concern is due to the fact that while the power grid is de-energized, there is always a possibility of contact of the power transmission line with humans, animals or trees. While low impedance power line faults can be detected based on the high amount of electrical current passing through the power transmission lines while the power grid/transmission line is energized, the recognition of a fault in a de-energized power grid/transmission line is challenging due to the absence of any electrical current passing through the power transmission line. Thus, in order to monitor the operational status of power transmission lines, including faults associated therewith, several fault detection/transmission line monitoring techniques have been used, including: TDR (time domain reflectometer), FBG (Fiber Bragg Grating), GPS (global positioning sensor) and magnetic based sensors. However, these techniques suffer from various drawbacks, some of which are discussed below.

In one power transmission line monitoring technique, a statistically based fault prediction method is used, whereby data insufficiency, imbalanced data constitution, and threshold settings are used. Their presence in a power distribution fault causes identification problems.

Fault detection in an offline, long-range power line transmission may be achieved via a fault detection method that is based on a time domain reflectometer method (TDR). However, the TDR method is complex, and requires complex hardware.

An optical-based fault current detection method for overhead power transmission lines has also been utilized. This method utilizes a Fiber Bragg Grating (FBG) sensor in order to measure the fault current, while an optical spectrum analyzer is used to monitor the reflected signal. As such, complex hardware is needed to execute this method. In addition, an ice detection sensor, which is based on an FBG strain measurement and a temperature sensor has been proposed, whereby the operation of the ice sensor is dependent on a complex hardware implementation. Thus, such FBG based approaches, again suffer from needing complex hardware.

Another method used to detect power transmission line faults is based on a non-contact magnetic field measurement, which is performed by magnetic sensors. Thus, the location of electrical faults may be identified based on a magnetic field that is measured along the power transmission line. The collected data can be further utilized to identify the fault type and the specific location of the fault within the fault span of the power transmission line. While this method is useful for detecting the high fault current that is produced by a faulty power line, it is not able to be used to predict the possibility of a fault occurrence in the overhead power line based on the power line's health condition.

Alternatively, a method using GPS sensors mounted on the power transmission lines to measure power line sag may be used to monitor powertransmission line health. Such GPS sensors are typically installed on the power line at a mid-point between any two power transmission line supporting towers. Using this method to measure sag in the power line is costly. A monitoring system for the evaluation of the low sag behavior of the overhead conductors in power transmission lines has also been pursued. Such monitoring systems measure power line conductor tension and temperature, as well as wind speed, in order to evaluate the wind load on the conductor of the power transmission line. Another method for measuring power transmission line sag has also been studied, which is based on the electrical current that is inducted on an extra or supplemental resistive line that is installed close to the original power line.

Furthermore, U.S. Pat. No. 6,807,036 teaches a ground fault interrupter that is configured to detect faults in a power transmission line. This interrupter is installed in series between an AC (alternating current) source and the connected power loads. Real-time power transmission line rating techniques based on the collected data from the sensors are presented by U.S. Pat. No. 8,386,198. As such, the conductor of the power transmission line may have a design ampacity that is based upon the design limitations and assumed weather conditions for the conductor's environment, and a dynamic line ampacity that is based upon the received sensor data and the received design limitations of the power transmission line.

Furthermore, since the high-frequency impedance of the power transmission lines of the power grid represents the physical characteristics of the power grid, both the health condition of the power grid and the presence of faults on the power grid can be detected and evaluated by measuring the high-frequency impedance of the power transmission lines of the power grid. However, existing high-frequency impedance measurement devices cannot be directly connected to the energized power grid or network, nor are they capable of measuring the impedance of a specific power transmission line segment.

Therefore, there is a need for a smart sensor network of the present invention that monitors the health condition or status of a power transmission line network of a power grid, and to detect any type of electrical fault in the power transmission line, in real-time. In addition, there is a need for a smart sensor network of the present invention that is capable of monitoring the high-frequency impedance of a power grid to identify the physical characteristics of the power grid, so as to monitor and evaluate both its health condition and the presence of electrical faults, in real-time. Furthermore, there is a need for a smart sensor network of the present invention that utilizes the detection of a high-frequency impedance fault to predict the health condition of an electrical fault occurrence on power transmission lines. Additionally, there is a need for a smart sensor network of the present invention that is configured to monitor the health condition of a power transmission system or power grid, which includes overhead, underground, or home/residential power transmission lines in real-time, as well as to monitor a power system of a DC railway system, whereby the present invention monitors the impedance of a desired power line segment in real-time. There is also a need for a smart sensor system of the present invention that can be coupled to a power transmission line, through magnetic coupling, including magnetic field coupling or inductive coupling.

SUMMARY OF THE INVENTION

In light of the foregoing, it is a first aspect of the present invention to provide a power transmission line monitoring system comprising a first sensor magnetically coupled to the power transmission line, and configured to inject a high frequency signal therein via the magnetic coupling; a second sensor magnetically coupled to the power transmission line at a predetermined distance from one end of the first sensor, wherein the second sensor blocks the injected signal back toward the first sensor; and a third sensor magnetically coupled to the power transmission line at a predetermined distance from another end of the first sensor, wherein the third sensor blocks the injected signal back toward the first sensor; wherein the first sensor detects the blocked signals from the second and third sensors to determine an impedance of a segment of the power transmission line that is between the second and third sensors.

It is another aspect of the present invention to provide a method of monitoring a power transmission line comprising the steps of magnetically coupling a first sensor, a second sensor, and a third sensor to the power transmission line, such that the first sensor is positioned between the second sensor and the third sensor at a predetermined distance; injecting a high frequency signal from the first sensor into the power transmission line; blocking the high frequency signal at the second and third sensors back toward the first sensor; and determining at the first sensor an impedance of a segment of the power transmission line that is between the second and third sensors.

BRIEF DESCRIPTION OF THE DRAWINGS

These and other features and advantages of the present invention will become better understood with regard to the following description, appended claims, and accompanying drawings wherein:

DETAILED DESCRIPTION OF THE INVENTION

Figure 1:
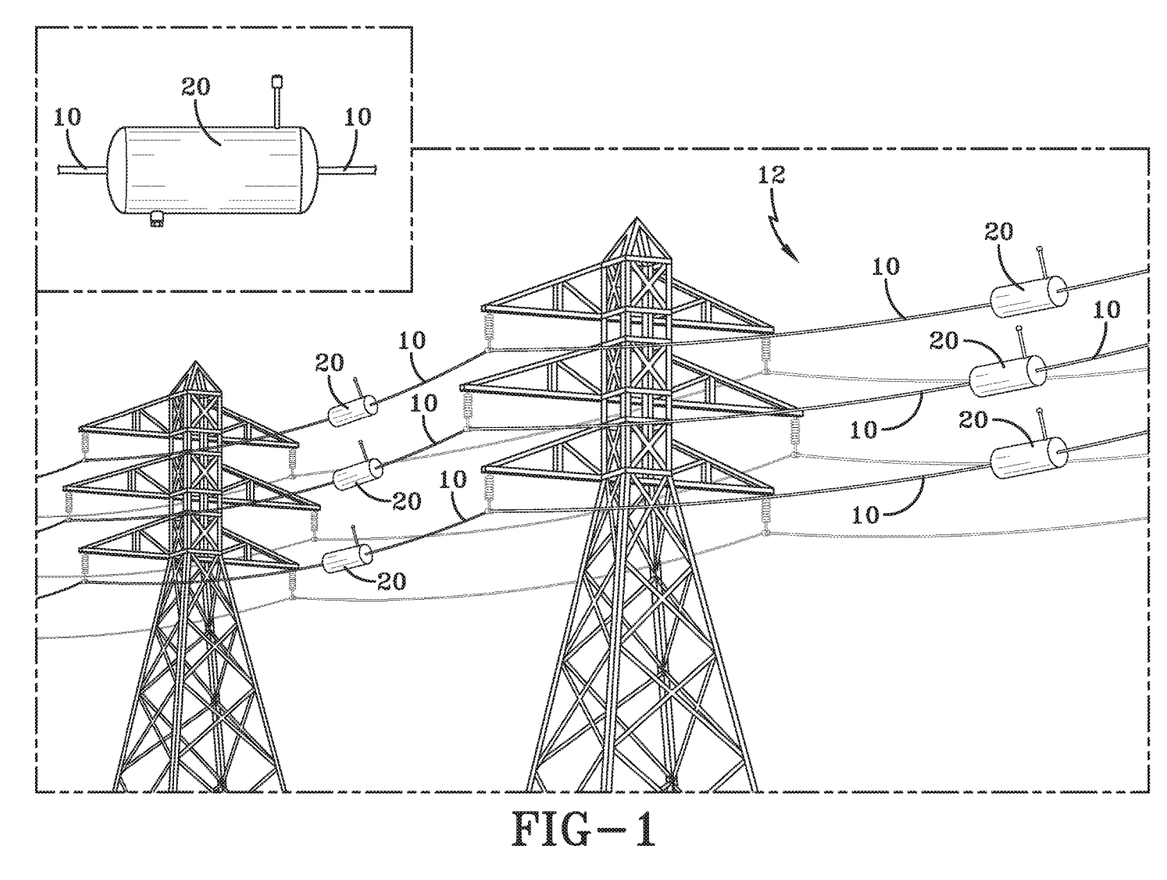
FIG. 1 is a perspective view of a plurality of smart sensors placed on a plurality of respective power transmission lines of a power grid in accordance with the concepts of the present invention.

A smart sensor utilized to monitor the presence of electrical faults in one or more power transmission lines 10 of an electrical power grid 12 is generally referred to by numeral 20, as shown in FIG. 1. The present invention utilizes a plurality of smart sensors 20 to form a smart network to monitor the health condition of the power grid 12 or a portion thereof. Specifically, the smart network, which is formed of a plurality of sensors 20 is also able to detect any type of electrical fault, such as a tree, human or animal contact, or other fault that is due to the poor health condition of the isolators, conductors, or towers, associated with one or more of the power transmission lines 10 of the power grid 12, in real-time. The sensors 20 are also configured to monitor and track the high-frequency impedance change in specific sections or segments of one or more power transmission lines 10 of the power grid 12 being monitored. Thus, because the variation in impedance of the power transmission line 10 that is being monitored contains information about the characteristics of the operating health and condition of the power transmission line, the real-time tracking and monitoring of the changes in impedance by the sensors 20 allows fault detection, and power line health/power grid health monitoring, to be performed by the present invention.

Figure 2:
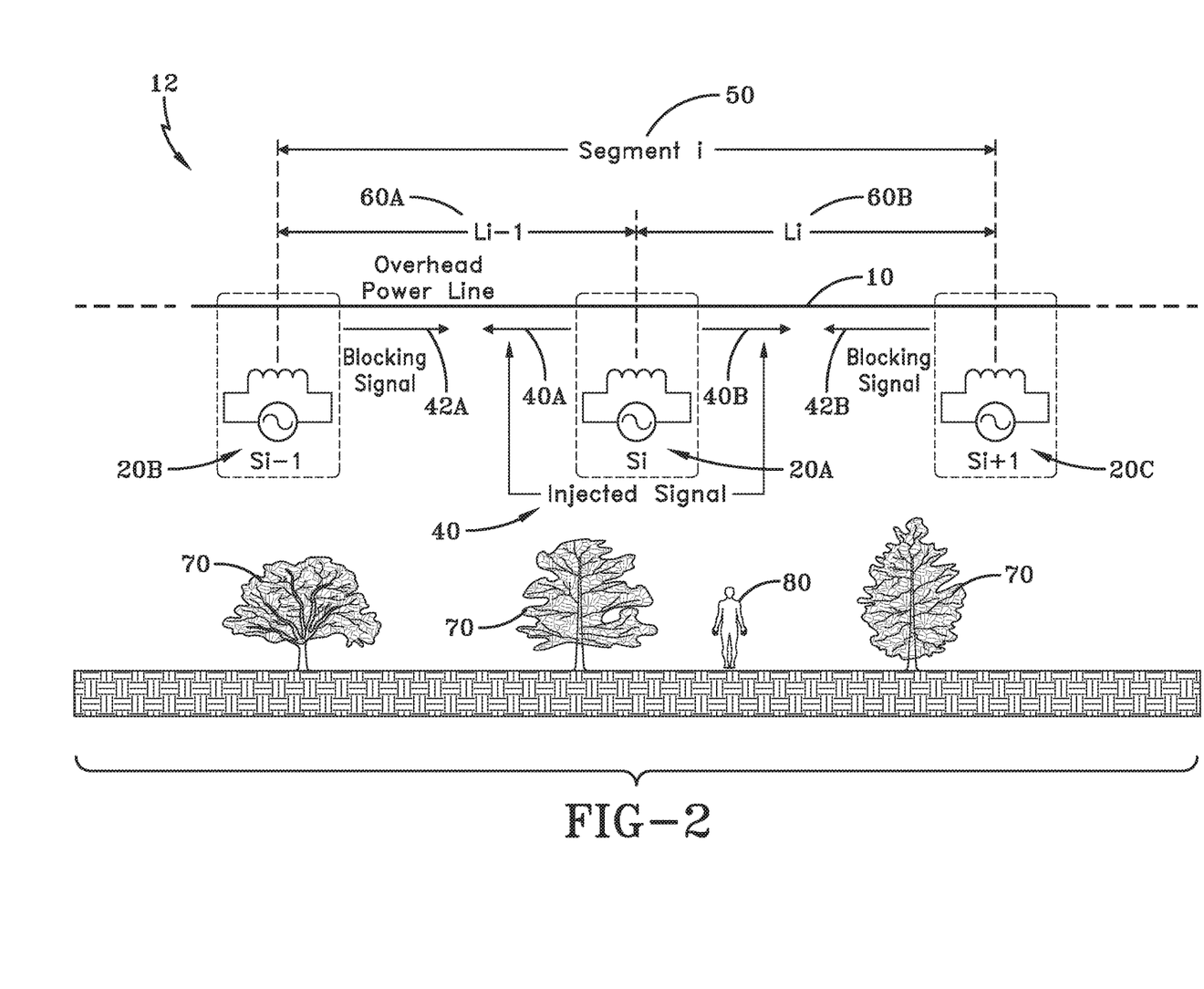
FIG. 2 is a schematic view of a plurality of smart sensors placed on a single power transmission line in accordance with the concepts of the present invention.
Figure 3:
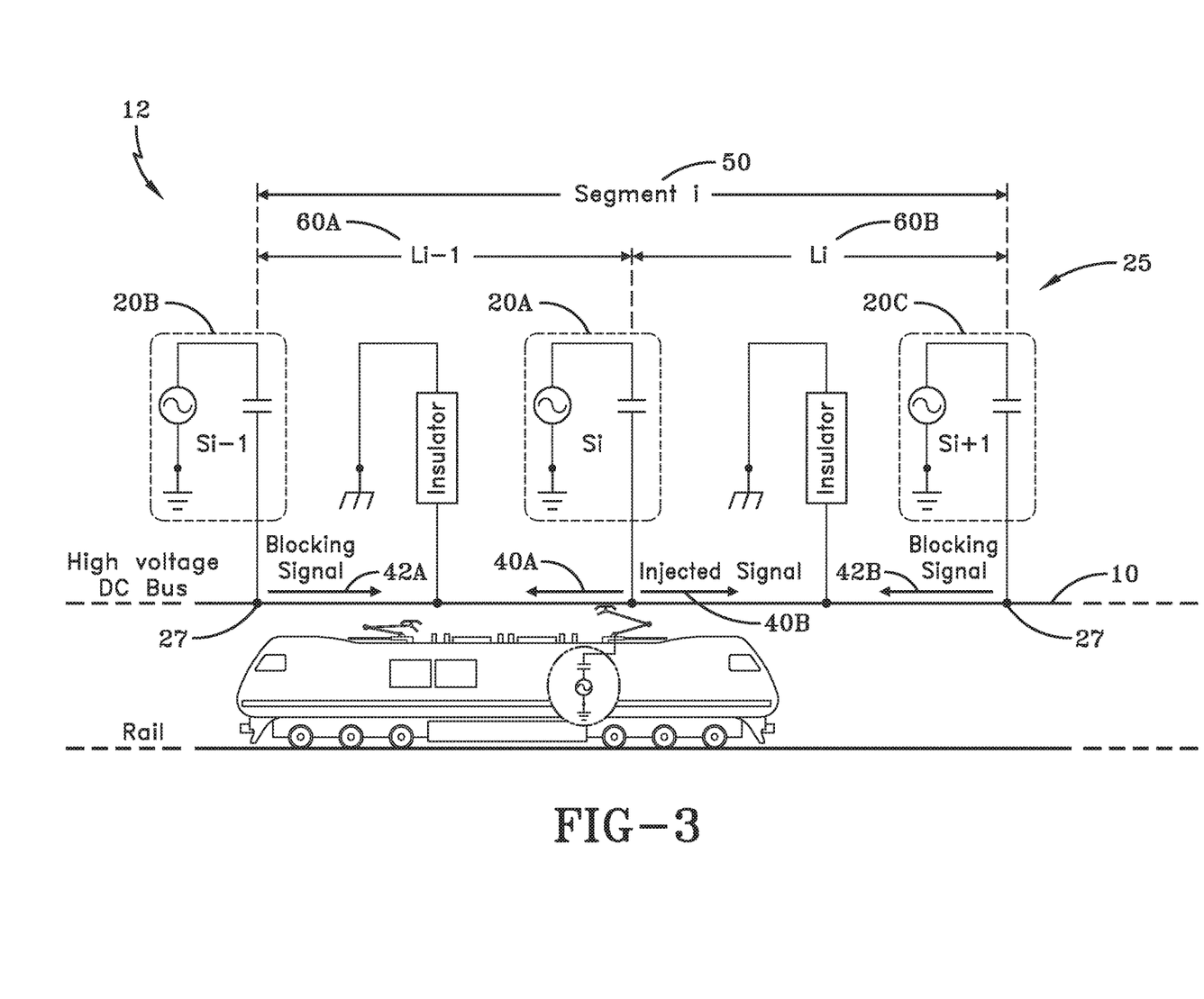
FIG. 3 is a schematic view showing a plurality of smart sensors, when placed on a D.C. railway system in accordance with the concepts of the present invention.

With respect to FIG. 2, in order to measure the high-frequency impedance in one or more power lines 10, at least three sensors 20, which are designated as, 20A, 20B and 20C, are spaced apart at a predetermined distance along a segment 50/section of the power transmission line 10, which has a predetermined length. However, in some embodiments the sensors 20A-C may be spaced apart from each other at any desired distance; including distances that are equal or unequal to each other. It should be appreciated that the power transmission line 10 includes an electrical conductor, which serves as the physical layer for the transmission of electrical current or energy loads. It is also contemplated that the power transmission line 10 or power line may comprise any suitable power transmission line, such as a high or low voltage overhead power transmission line, an underground power transmission line, an indoor power transmission line, or an electric railway power line system 25, such as the D.C. railway power line system shown in FIG. 3, for example. In addition, the sensors 20A-C are positioned in proximity with the power transmission line 10 so that they are magnetically coupled (e.g. magnetic field coupling, inductive coupling) with the power transmission line 10. As such, the sensors 20B and 20C, which are configured as blocking sensors, are positioned at the end of the transmission line segment 50, while sensor 20A, which is configured as a detecting sensor, is positioned substantially in the middle of the transmission line segment 50. It should be appreciated that in the case of an electric railway or train system 25, the blocking sensors 20B and 20C are positioned at each terminal station 27, of a railway system, while the detection sensor 20A, which performs signal injection, may be placed anywhere between the sensors 20B and 20C. It should be appreciated that in some embodiments the electric railway system 25 may be a D.C. (direct current) railway system.

Next, a high-frequency signal 40 is injected, non-intrusively (i.e. through the magnetic coupling, (such as magnetic field coupling or inductive coupling for example) between the sensor 20A and the power transmission line 10, into a midsection of the desired power line segment 50, by the smart sensor 20A. The smart sensor 20A, which is configured to inject the high-frequency signal, is positioned between the pair of blocking sensors 20B and 20C. As such, the injected signal 40 is transmitted along the power line segment 50 from each end of the sensor 20A, such that one injected signal 40A propagates along half/or portion 60A of the power line segment 50 and is then blocked by smart sensor 20B, while another injected signal 40B propagates along half/or portion 60B of the power line segment 50 and is then blocked by smart sensor 20C. Signal blocking sensors 20B and 20C eliminate the effect of impedances that are connected to the segment 50 through blocking the high frequency currents. That is, performing the blocking technique allows the impedance of the desired segment 50 of the power transmission line 10 to be isolated from the impedance of the rest of the power grid 12, and thus independently or separately measured. As such, the impedance of the isolated power line segment 50 is calculated by the sensor 20A by measuring the injected high-frequency voltage and the resultant high-frequency current flowing in the power transmission line segment 50. The determination or measurement of the impedance of the power line segment 50 can be performed through hardware, software of a combination of hardware electronics and the software programming on the processors provided by the hardware, which may be provided by the sensors 20 or that may be provided remotely at a remote computer.

Thus, the signal blocking technique utilized by the present invention provides sensors 20A-C that are magnetically coupled (e.g. magnetic field coupling, inductive coupling) to the power transmission line 10, which injects a high-frequency signal into the power transmission line 10 by the detection sensor 20A, which is then canceled by the blocking sensors 20B and 20C. Thus, in contrast to existing high-frequency filtering methods, the method of the present invention does not require any direct physical connection to the overhead power line 20, instead, the sensors 20 of the present invention are magnetically coupled (e.g. magnetic field coupling, inductive coupling) to the power transmission line. FIG. 2 illustrates the arrangement of the non-intrusive (i.e. magnetically coupled) sensors 20A-C that are used to measure the high-frequency impedance of the desired power line segment, such as segment 50. Each smart sensor 20A-C is capable of measuring the impedance of the power line segment 50 in real-time. It should be appreciated that while a group of three sensors 20A-C is needed to carry out the monitoring functions of the present invention, any number of groups of sensors may be used along the full length of the power transmission line 10 to monitor the performance of a plurality of segments to obtain impedance measurements and power line/power grid health status with increased precision or resolution.

The impedance of the power grid 12, when subject to the high-frequency signal 40, is monitored by tracking the injected signal 40 via the sensor 20A. As such, the difference between a pre-measured or stored impedance of the section 50 of the power transmission line 10 being monitored under healthy conditions (no faults), and the actual, or currently measured impedance of the predetermined section 50 of the power transmission line 10 being monitored provides information about the health of the power line 10.

In addition, the sensors 20A-C may be configured to operate in different modes. For example, as discussed above, the sensor 20A operates to inject a high-frequency signal 40A-B, and to then detect the blocked signals 42A-B, while sensors 20B and 20C operate as signal blockers, and include stop filters that isolate the power grid 12 impedance from the impedance of the power transmission line section 50 being monitored. As such, the sensor 20A operates as a signal injector, which injects a high-frequency signal into the power transmission line 10, while also acting as a detection/monitor, thereby tracking or sensing the power line impedance variation of the power line section 50 being monitored. The impedance of the section 50 subjected to the high-frequency signal 40 is continuously monitored and compared with the baseline impedance of the power line section 50 to monitor the health of the power grid 12. Thus, because different sections 50 of the power transmission line 10 may be studied or monitored, the sensors 20A-C may be selectively operated in any one of the injection/detection mode or blocking mode discussed above to achieve the monitoring of a particular power line segment 50 in the total length of a given power transmission line 10. It should be appreciated that the signal 40 may be injected or the detection thereof may be performed periodically at any desired pulse rate or time interval.

In addition, various electrical faults, that may affect the power transmission line 10, are represented in FIG. 2, such as trees 70 and human individuals 80 for example. That is, such faults are defined as the electrical contact of the power transmission line 10 with a non-conductive surface like a tree, animal, human body or any other non-conductive surface. However, the present invention is configured to detect an electrical fault of the power transmission line 10 that is the result of any structure or item coming in contact with the transmission line 10.

Figure 4:
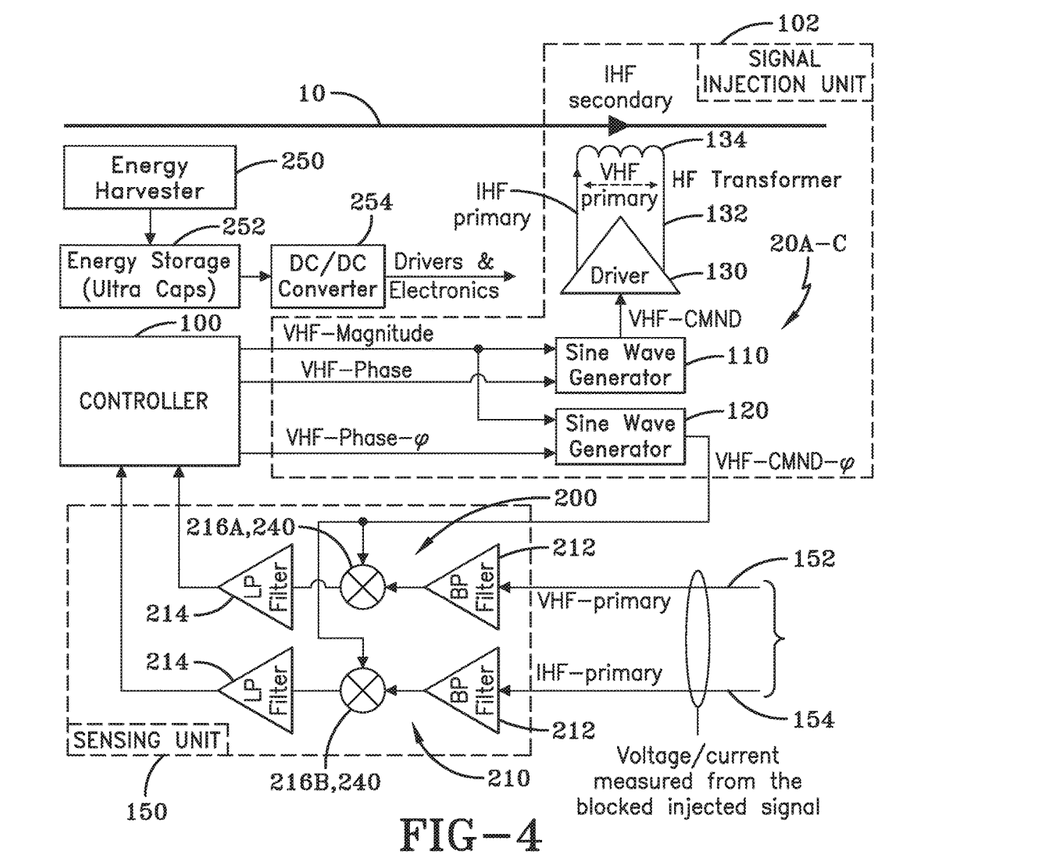
FIG. 4 is a schematic view showing the components of the smart sensor, including a signal injection unit, and a signal sensing unit, in accordance with the concepts of the present invention.

Continuing to FIG. 4, the sensor 20, which is used to embody sensors 20A-C discussed above, includes a controller 100, which is configured with the necessary hardware, software or combination thereof to carry out the functions of the present invention discussed herein. The controller 100 is coupled to a signal injection unit 102, which includes sine wave generators 110 and 120. The output of the sine wave generator 110 is coupled to a driver 130, which is attached to a high-frequency transformer 132. The transformer 132 includes a coupling coil 134 that is used to magnetically couple (e.g. magnetic field coupling, inductive coupling) the sensor 20 to the power transmission line 10. VHF denotes the high-frequency voltage that is across the primary winding of the coil 134, and IHF is the high-frequency current passing through the coil 134. In particular, the output of the sine wave generator 110 is a VHF-CMND/command voltage signal that is applied to the driver 130, which initiates the application of the injected VHF (i.e. very high frequency) signal into the power transmission line 10 via the magnetic coupling established between the coil 134 and the power transmission line 10.

The output of the sine wave generator 120 is coupled to a sensing unit 150 that includes a pair of filters 200 and 210. Each filter 200 and 210 includes a series coupled band-pass filter component 212 and a low-pass filter component 214. As such, the output of the band-pass filter component 212 of filter 200 is coupled at a node 216A to the input of the low-pass filter component 214, and whereby the output of the band-pass filter component 212 of filter 210 is coupled at node 216B to the input of the low-pass filter component 214. That is, the output of the sine wave generator 120 is coupled to nodes 216A-B positioned between the band-pass filter component 212 and the low-pass filter component 214 of each filter 200 and 210. The output of each of the low-pass filter components 214 of the filters 200 and 210 are coupled to the controller 100. In addition, the input of the band-pass filter component 212 of the filter 200 is a VHF-primary signal at line/wire 152, and the input of the band-pass filter component 212 of the filter 210 is an IHF-primary signal at line/wire 154, whereby signals 152 and 154 are obtained from the coil 134. The VHF-primary signal is the voltage induced across the current sensing coil 134 and the IHF-primary is the current passing through the coil 134. In one aspect, the VHF-primary signal is generated by the driver 130 based on the commanded signal from the controller 100. In the case of the signal blockers 20B-C, the commanded voltage is calculated to be able to block the high-frequency signal in the power transmission line segment 50 line. In the case of signal injector 20A the commanded amount is determined so that injected high-frequency signal 40 is within the limits of standard practices and electrical codes. Magnetic of the sensor 20 to the power transmission line 10 is done through a magnetic core, having primary and the secondary coils. The driver 130 is connected to a primary winding or coil 134, which has multiple turns, while the power transmission line 10, or segment 50 thereof, is considered to be the secondary winding of the core.

In addition, the sensor 20 includes an in-series coupled energy harvester 250, and energy storage device 252, such as an ultra- or super-capacitor, and a DC/DC converter 254. The output of the DC/DC converter 254 is coupled to all other electronic components or blocks of the sensor 20, including components 100, 110, 120, 130, 212, 216, and 214, so as to provide power for such components to function. Typically, low-voltage levels (e.g. 5V and 3.3 V) are required to be able to power all the electronics circuits in the sensor 20. The driver 130 is an electronic power amplifier, which conditions the commanded signal from the controller 100 to be able to drive the primary side of the HF transformer 132. It should be appreciated that any commercial power amplifier can be used as the driver 130 to function as an amplifier.

Figure 5:
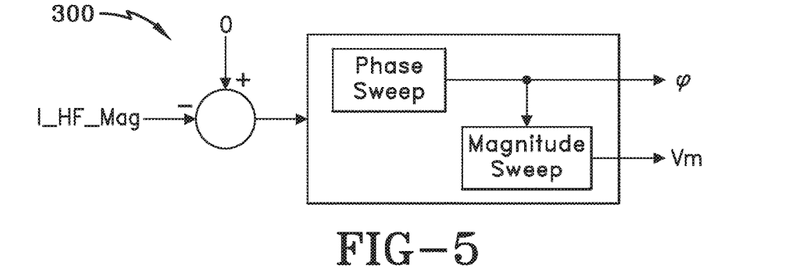
FIG. 5 is a block diagram of a control structure utilized by a signal injection unit that is provided by the smart sensor in accordance with the concepts of the present invention.

During operation of the sensor 20, when placed in an injection/detection mode, such as in the case of sensor 20A discussed above, the magnitude and phase of the signal 40 to be injected into the power transmission line segment 50 is commanded by the controller 100 for receipt by the sine wave generator 110. A block diagram of a control process 300 associated with the signal injection unit 102 is shown in FIG. 5. The measured voltage and current received by the sensing unit 150 of the sensor 20A when operated in an impedance detection mode as a result of the injected signal 140, (via coil 134) are passed by wires 152 and 154 through the band-pass filter components 212 of the sensing unit 150 to generate filtered signals. In order to extract the complex form of the measured voltage and current, the filtered signals are each multiplied at nodes 216A-B of respective filters 200, 210 by respective multipliers 240A-B by a phase shifted sine wave that is provided by sine wave generator 120. The signals output by of the multipliers 240A-B are each low-pass filtered by the filters 214, whereupon the signals are recorded by the controller 100. The amount of phase shift that is applied to the multiplier 240 is swept to determine the magnitudes and phases of the measured high frequency voltages and currents. The complex form of the power transmission line impedance is then determined based on the magnitude and phase of the injected voltage and current. The amount of phase shift that is applied to the multipliers 240A-B in order to achieve the highest possible amplitude after the low pass filters 214 is what determines the actual phase of the voltage and current signals. The complex form of the power line impedance at a higher frequency represents the physical condition of the power line in real-time, which allows a model for the health condition of the power transmission line 10 to be obtained. The impedance of the power transmission line 10 at a healthy condition is measured, and taken as a reference value. The impedance of the power transmission line 10 is monitored continuously, and is compared with the reference impedance that is measured at previously determined or known healthy conditions of the power transmission line 10. If the difference in impedance is greater that a predetermined threshold value, then the sensor 20 alarms (notified/indicates) the operator of the power grid 12 about the health condition of the power transmission line 10. This comparison may occur at a remote computer, discussed below, or at the sensors 20 themselves.

It should be appreciated that the sensors 20 may include a wired or wireless communication interface, which allows one or more sensors 20 to communicate with each other, as well as allows the sensors 20 to communicate with a local or remote computer system. The local or remote computer system may be configured to analyze the data obtained from the sensors 20, and generate the necessary alerts/reports prompts identifying the health of the power transmission line 10 and/or power grid 12. In other embodiments, the sensor 20 may generate the alert/report prompt indicating the health status of the transmission line 10 or power grid 12. In addition, the sensor 20 or the remote computer, that are in communication with the sensors 20 may communicate with a circuit breaker that controls the application of electrical power to the power transmission line 10. As such, the sensor 20 or remote computer may command the circuit breaker to toggle from an ON state or to an OFF state, or vice versa.

Therefore, one advantage of the present invention is that a smart sensor network enables is non-intrusively coupled to a power transmission line. Another advantage of the present invention is that a smart sensor network the detection and monitoring of the impedance of a specific power line segment to determine the overall health of a power transmission line.

Thus, it can be seen that the objectiveness of the present invention have been satisfied by the structure and its method for use presented above. While in accordance with the Patent Statutes, only the best mode and preferred embodiments have been presented and described in detail, with it being understood that the present invention is not limited thereto or thereby. Accordingly, for an appreciation of the true scope and breadth of the invention, reference should be made to the following claims.

What is claimed is:

1. A power transmission line monitoring system comprising:
   a plurality of sensors configured to be magnetically coupled to the power transmission line, and spaced apart at a predetermined distance;
   wherein said plurality of sensors are configured to be selectively controlled so that one or more of said sensors injects a high frequency signal into a transmission line segment, and one or more of said sensors are configured to be selectively controlled to block the injected signal as a blocked signal for receipt by said sensor that injected the signal, such that an impedance of a portion of the transmission line, carrying the signal that was blocked, is determined based on the signal that was blocked.

2. The power transmission line monitoring system of claim 1, wherein the impedance is determined in real-time.

3. The power transmission line monitoring system of claim 1, wherein said plurality of sensors include a controller to compare a predetermined impedance with said determined impedance to obtain a difference value, such that if said difference value is greater than a predetermined threshold value, said first sensor generates a prompt.

4. The power transmission line monitoring system of claim 3, wherein said controller is coupled to a circuit breaker that is associated with the power transmission line, such that said circuit breaker is controlled based on said prompt, so as selectively de-energize the power transmission line.

5. The power transmission line monitoring system of claim 1, wherein the power transmission line is provided by a railway system.

6. The power transmission line monitoring system of claim 1, wherein the power transmission line is an overhead power transmission line, an underground power transmission line, or a low-voltage power transmission line.

7. A method of monitoring a power transmission line comprising the steps of:
   magnetically coupling a plurality of sensors to the power transmission line, such that said sensors are spaced apart at a predetermined distance;
   selectively controlling said plurality of said sensors to be a signal injecting sensor or a signal blocking sensor;
   injecting a high frequency signal from one or more of said sensors configured as a signal injecting sensor into the power transmission line;
   blocking said high frequency signal at said sensor configured as a signal blocking sensor;
   receiving at said signal injecting sensor the signal that was blocked; and
   determining an impedance of a segment of the power transmission line, carrying the signal that was blocked, wherein said impedance is based on the signal that was blocked.

8. The method of monitoring a power transmission line claim of 7, wherein said determining step is performed in real-time.

9. The method of monitoring a power transmission line of claim 7, further comprising:
   coupling a controller to said plurality of sensors, wherein said controller compares a predetermined impedance with said determined impedance to obtained a difference value; and
   generating a prompt at said controller if said difference value is greater than a predetermined threshold value.

10. The method of monitoring a power transmission line of claim 9, further comprising:
    coupling a circuit breaker to said controller, said circuit breaker being associated with the power transmission line; and
    controlling said circuit breaker based on said prompt to selectively de-energize the power transmission line.

11. The method of monitoring a power transmission line of claim 7, wherein the power transmission line is provided by a railway system.

12. The method of monitoring a power transmission line of claim 7, wherein the power transmission line is an overhead power transmission line, an underground power transmission line, or a low-voltage power transmission line.

* * * * *